United States Patent
Hetherington et al.

(10) Patent No.: US 9,337,790 B2
(45) Date of Patent: May 10, 2016

(54) SYSTEM AND METHOD FOR ENHANCING COMPREHENSIBILITY THROUGH SPATIALIZATION

(71) Applicant: QNX Software Systems Limited, Kanata (CA)

(72) Inventors: Phillip Alan Hetherington, Port Moody (CA); Shreyas Paranjpe, Vancouver (CA)

(73) Assignee: 2236008 Ontario Inc., Waterloo, Ontario (CA)

( * ) Notice: Subject to any disclaimer, the term of this patent is extended or adjusted under 35 U.S.C. 154(b) by 227 days.

(21) Appl. No.: 14/089,318

(22) Filed: Nov. 25, 2013

(65) Prior Publication Data

US 2015/0146889 A1    May 28, 2015

(51) Int. Cl.
  *H04B 1/00*  (2006.01)
  *H03G 3/00*  (2006.01)
  *H04M 3/56*  (2006.01)
  *H04R 27/00*  (2006.01)

(52) U.S. Cl.
  CPC .............. *H03G 3/00* (2013.01); *H04M 3/568* (2013.01); *H04R 27/00* (2013.01); *H04S 2400/11* (2013.01)

(58) Field of Classification Search
  CPC ......... H04M 3/568; H03G 3/00; H04R 27/00; H04S 2400/11
  USPC ........................................................ 381/119
  See application file for complete search history.

(56) References Cited

U.S. PATENT DOCUMENTS

| | | | |
|---|---|---|---|
| 2008/0298610 A1 | 12/2008 | Virolainen et al. | |
| 2010/0273505 A1* | 10/2010 | Moller | H04S 1/002 455/456.1 |
| 2010/0316232 A1 | 12/2010 | Acero et al. | |
| 2015/0078594 A1* | 3/2015 | Mcgrath | H04S 7/30 381/300 |

FOREIGN PATENT DOCUMENTS

WO    WO 2013/142657 A1    9/2013

OTHER PUBLICATIONS

European Search Report for corresponding European Application No. 14194593 dated Apr. 20, 2015, 7 pages.

\* cited by examiner

*Primary Examiner* — Paul S Kim
(74) *Attorney, Agent, or Firm* — Brinks Gilson & Lione

(57) ABSTRACT

A system and method for enhancing comprehensibility through spatialization may receive two or more audio signals each associated with one of two or more audio sources. A respective panning gain may be calculated for each of the two or more audio signals using a count of the total number of audio sources and a count of a total number of output channels. The respective panning gain may be calculated further responsive to audio source metadata associated with each of two or more audio sources. Each of the two or more audio signals may be gain adjusted responsive to the respective panning gain. Each of the two or more gain adjusted audio signals may be mixed to create two or more output channels wherein a reproduction of the output channels produces enhanced comprehensibility.

18 Claims, 4 Drawing Sheets

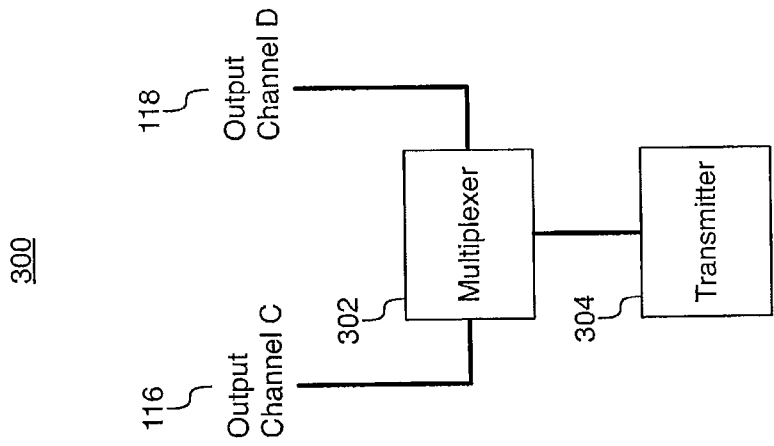
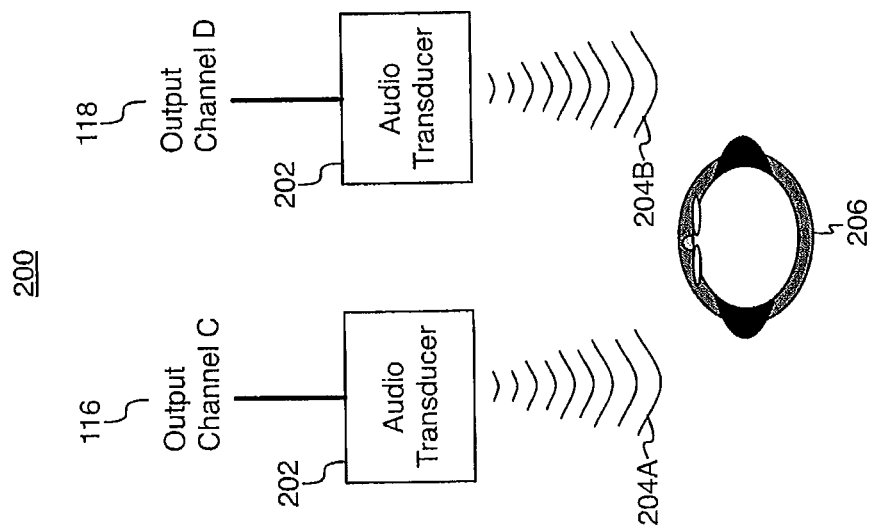

SYSTEM AND METHOD FOR ENHANCING COMPREHENSIBILITY THROUGH SPATIALIZATION

BACKGROUND

1. Technical Field

The present disclosure relates to the field of processing audio signals. In particular, to a system and method for enhancing comprehensibility through spatialization.

2. Related Art

Multiparty conference calls usually mix audio signals from multiple parties into a single mono audio signal. Each party participating in the multiparty conference call receives a mix of the audio signals associated with the other multiparty conference call participants. Audio signal processing may be applied to the audio signals including echo cancellation and noise suppressors to enhance the mixed audio signals. Nonetheless, when more that one party speaks simultaneously, comprehensibility may be limited.

BRIEF DESCRIPTION OF DRAWINGS

The system and method may be better understood with reference to the following drawings and description. The components in the figures are not necessarily to scale, emphasis instead being placed upon illustrating the principles of the disclosure. Moreover, in the figures, like referenced numerals designate corresponding parts throughout the different views.

Other systems, methods, features and advantages will be, or will become, apparent to one with skill in the art upon examination of the following figures and detailed description. It is intended that all such additional systems, methods, features and advantages be included with this description and be protected by the following claims.

FIG. 2 is a schematic representation of a user listening to a sound field reproduction of the output channels from a system for enhancing comprehensibility through spatialization.

FIG. 3 is a schematic representation of a computing device to multiplex and transmit the output channels from a system for enhancing comprehensibility through spatialization.

DETAILED DESCRIPTION

Figure 1:
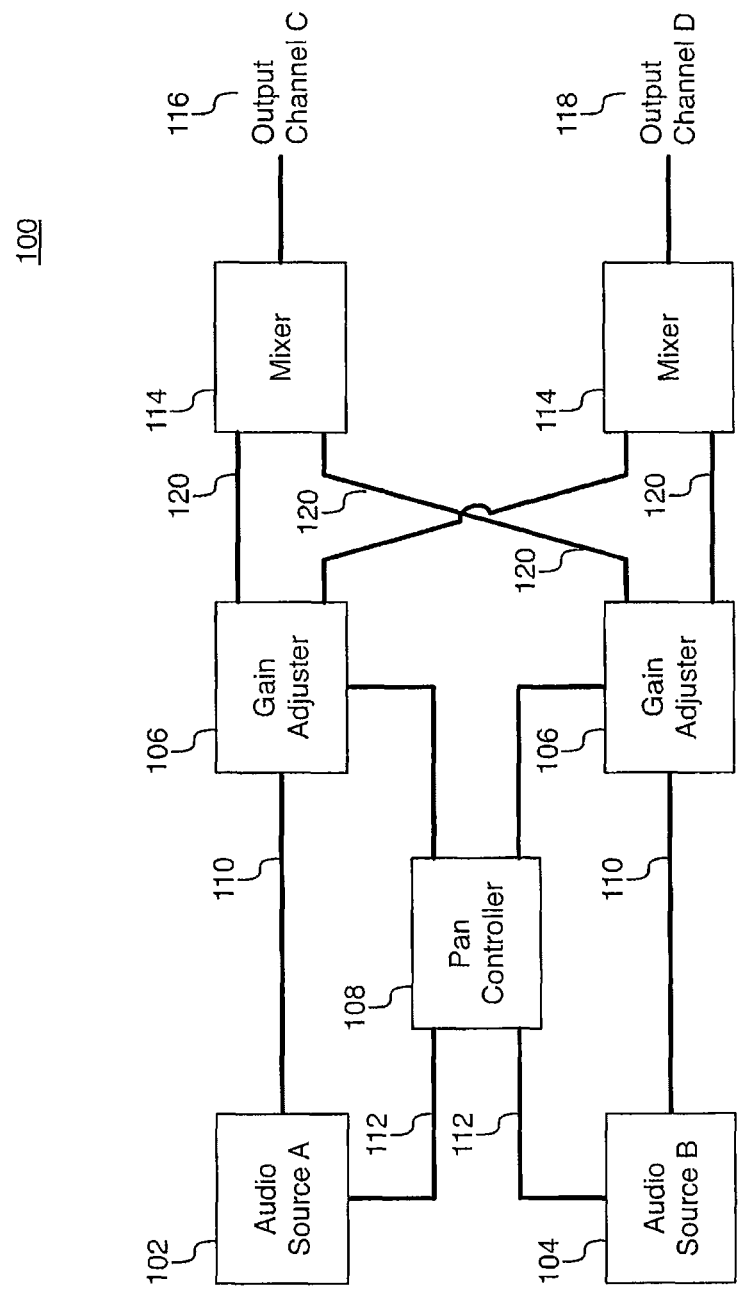
FIG. 1 is a schematic representation of a system for enhancing comprehensibility through spatialization.

A system and method for enhancing comprehensibility through spatialization may receive two or more audio signals each associated with one of two or more audio sources. A respective panning gain may be calculated for each of the two or more audio signals using a count of the total number of audio sources and a count of a total number of output channels. The respective panning gain may be calculated further responsive to audio source metadata associated with each of two or more audio sources. Each of the two or more audio signals may be gain adjusted responsive to the respective panning gain. Each of the two or more gain adjusted audio signals may be mixed to create two or more output channels wherein a reproduction of the output channels produces enhanced comprehensibility.

Multiparty conference calls usually mix multiple audio signals into a single mono audio signal. Each party in the multiparty conference calls receives a mix of the audio signals associated with the other multiparty conference call participants. Audio signal processing may be applied to the audio signals including echo cancellation and noise suppressors to enhance the mixed audio signals. Nonetheless, when more that one party speaks simultaneously, comprehensibility may be limited.

For some parties (a.k.a. participants), two or more speakers, or audio transducers, in a stereo or multichannel configuration may be available in their listening environment. Comprehensibility for a listening party may be enhanced, or improved, by placing each speaking party in the multiparty conference call in what is perceived to be a different spatial location in the sound field reproduced by the two or more audio transducers. Placing each party in the multiparty conference call into a different spatial location may be achieved by panning the audio signal associated with each party before mixing into two or more output channels. Panning the audio signals responsive to other associated information may further improve the comprehensibility. For example, panning the audio signals based on approximate location or importance of the party. The associated information may be transmitted with the audio signals continuously, negotiated when the multiparty conference call is initialized or when a new party enters the multiparty conference call.

Panning the audio signal associated with each party into a different spatial location may depend on the number and location of the audio transducers relative to the listening party. A typical two audio transducer configuration may reproduce a stereo sound field that may be perceived by the listening user as 2-dimensional (2D). One audio transducer may be referred to as the left speaker and the other audio transducer as the right speaker. An audio signal may be panned to be anywhere between the left and the right speakers. A typical multichannel audio transducer configuration may including left, center, right, left surround and right surround speakers that may be capable of producing a 2D sound field that surrounds the listening party. The audio signals may be placed in a spatial location anywhere surrounding the listing party in the typical multichannel audio transducer configuration. Adding an audio transducers above a listener in a stereo or multichannel configuration may produce a 3-dimensional sound field where the audio signal may be placed in a spatial location above or around a listening party.

Panning and mixing the associated audio signals from each party may be performed in a conference bridge or in an end user device. The conference bridge configuration may receive one or more audio signals associated with each party and create, or generate, two or more output channels for each party. Each party may have a different number of audio signals and a different number of output channels. The conference bridge may receive the associated information that describes a location and/or an importance (i.e. priority) from each party. Alternatively, an end user computing device configuration may have each end user computing device receive the one or more audio signals from each party and perform the panning and mixing on the end user computing device. The end user computing device may receive the associated information in a similar fashion to that of the conference bridge configuration.

FIG. 1 is a schematic representation of a system for panning multiple audio signals 100. Two or more gain adjusters 106 may each receive an audio signal 110 associated with one of two or more audio sources (102 and 104). A pan controller 108 may receive audio source metadata 112 from each of the two or more audio sources (102 and 104). The pan controller 108 may calculate a respective panning gain for each of the two or more audio signals 110. The panning gain may indicate the proportional amount of each of the two or more audio signals 110 directed to each of two or more output channels (116 and 118). The gain adjusters 106 may adjust each of the two or more audio signals 110 using the respective panning gain. The gain adjusters 106 may multiply each of the two or more audio signals 110 by each respective panning gain on a sample-by-sample basis. Mixers 114 may mix each of the two or more gain adjusted audio signals 120 to generate two or more output channels (116 and 118).

FIG. 2 is a schematic representation of a user listening to a sound field reproduction of the output channels from a system for enhancing comprehensibility through spatialization 200. Two or more audio transducers 202 may reproduce a sound field (204A and 204B) using the output channels (116 and 118) generated from the system for enhancing comprehensibility through spatialization. A user 206, or listening party, may listen to, or perceive, a stereo sound field (204A and 204B).

The panning controller 108 may calculate a respective panning gain for each of the two or more audio signals 110. Each respective panning gain may be calculated using a count of the total number of audio sources 110 and a count of a total number of output channels (116 and 118). The panning gains may be calculated so that the comprehensibility of the output channels (116 and 118) is enhanced. For example, a system that comprises two audio sources (102 and 104) and two output channels (116 and 118) may direct all of the audio signal 110 associated with audio source A 102 to output channel C 116 and all of the audio signal 110 associated with audio source B 104 to output channel D 118. The sound field (204A and 204B) reproduction of the output channels (116 and 118) may provide enhanced comprehensibility of the audio sources (102 and 104) to the user 206 when the two audio sources (102 and 104) are separated in the sound field (204A and 204B). In a stereo example, audio source A 102 is panned to the left sound field 204A and audio source B 104 is panned to the right sound field 204B. A third audio source in a stereo sound field may be panned equally to both the left sound field 204A and the right sound field 204B. A multichannel sound field (204A and 204B) may have each audio source (102 and 104) panned to a different location in the sound field (204A and 204B).

The audio source metadata 112 may include any one or more of audio source location information, audio source priority, audio source grouping, audio source role assignment, audio transducer configuration and other similar audio source related information. The audio source location information may include global positioning system (GPS) coordinates, Internet Protocol (IP) address localization and predefined location information. IP address localization may indicate an approximate geographic location. Predefined location information may include, for example, a user associated with audio source A 102 setting an approximate geographic location such as, for example, an office name, city name or country name. The audio source priority may indicate the relative importance of each of the two or more audio sources (102 and 104). The relative importance of each of the two or more audio sources (102 and 104) may be predefined, for example, the host of a multi party conference call may be indicated as a higher priority audio source (102 and 104). The audio source grouping may indicate that two or more audio sources (102 and 104) having similar grouping, for example, two or more audio sources (102 and 104) may be considered to be a single audio source (102 and 104). The audio source role assignment may indicate that two or more audio sources (102 and 104) may have different characteristics, for example, one audio source (102 or 104) may have a role as an active speaking participant and another audio source (102 or 104) may be only a listening party. The audio transducer configuration may indicate the physical layout of the audio transducers, for example, a stereo or a 5.1 channel multichannel configuration as described above.

The panning controller 108 may utilize the audio source metadata 112 when calculating the respective panning gain for each of the two or more audio signals 110. The audio source metadata 112 may provide differentiation between each audio source (102 and 104) where each audio source (102 and 104) may be reproduced in the sound field (204A and 204B) as a function of the audio source metadata 112. The calculated panning gain responsive to the audio source metadata 112 may further enhance comprehensibility through spatialization. In one example, an audio source (102 and 104) located in San Francisco, Calif. may be reproduced in the left audio transducer 202, an audio source (102 and 104) located in Chicago, Ill. may be reproduced equally in the left and right audio transducers 202 and an audio source (102 and 104) located in New York, N.Y. may be reproduced in the right audio transducer 202. In another example, an automotive racing team may include a driver, a pit crew team and a team leader all communicating using headphones that have two audio transducers 202. The driver, the pit crew team and the team leader may be considered independent audio sources (102 and 104). Each audio source (102 and 104) may include predefined audio source metadata 112 for the automotive racing team. Each listening party may receive a different mix in the two output channels (116 and 118). For example, the team leader may receive the audio signal 110 associated with the driver panned left and the audio signal 110 associated with the pit crew panned right. The driver may receive the audio signal 110 associated with the team leader panned to the center and the audio signal 110 associated with the pit crew panned left. In this example, reproducing the audio signals 110 associated with the automotive racing team members may enhance comprehensibility by having the spatial position of each speaker provide, to the listener, a cue as to who is speaking event in the presence of a garbled or noisy audio signal and/or of background noise in the listening environment. In another example, audio source metadata 112 that may indicate a higher priority audio source (102 and 104) may pan the associated audio source (102 and 104) to the center of a stereo or multichannel audio reproduction.

The panning controller 108 may utilize a received near end panning control when calculating the respective panning gain for each of the two or more audio signals 110. The user 206 may generate the near panning user control received by the panning controller 108 allowing the user 206 to dynamically pan each of the two or more audio signals 110. The user 206 may dynamically pan each of the two or more audio signals 110 to further enhance comprehensibility of one or more audio signals 110 of interest to the user 206. For example, the user may pan an audio signal 110 of interest to the center position of the sound field (204A and 204B) and pan the remaining audio signals 110 into the left and right positions of the sound field (204A and 204B). The user 206 may change which one or more of the audio signals 110 are of interest at anytime utilizing the near end panning control.

The panning controller 108 may receive a far end panning control that may be included in the audio source metadata 112. A far end user may dynamically pan each of the two or more audio signals 110 in the reproduced sound field (204A and 204B) of a user 206 by generating the far panning user control included in the audio source metadata 112. For example, the far end user may be the host of a multi party conference call. In some situations the host may desire the audio signal associated with the host to be in the center position of reproduced source field (204A and 204B). The host may dynamically change when the host audio signal is panned to the center position. The host may indicate where to position each of the two or more audio signals 110 utilizing the far end panning control included in the audio source metadata 112.

FIG. 3 is a schematic representation of a computing device to multiplex and transmit the output channels from a system for panning multiple audio signals 300. The two or more output channels (116 and 118) may be combined using a multiplexer 302. The multiplexer may interleave the output channels (116 and 118) on a sample-by-sample basis or in blocks of samples. A transmitter 304 may transmit the multiplexed output channels to a receiver, not shown. The system 300 may be utilized to transmit the output channels to an end user computing device.

Figure 4:
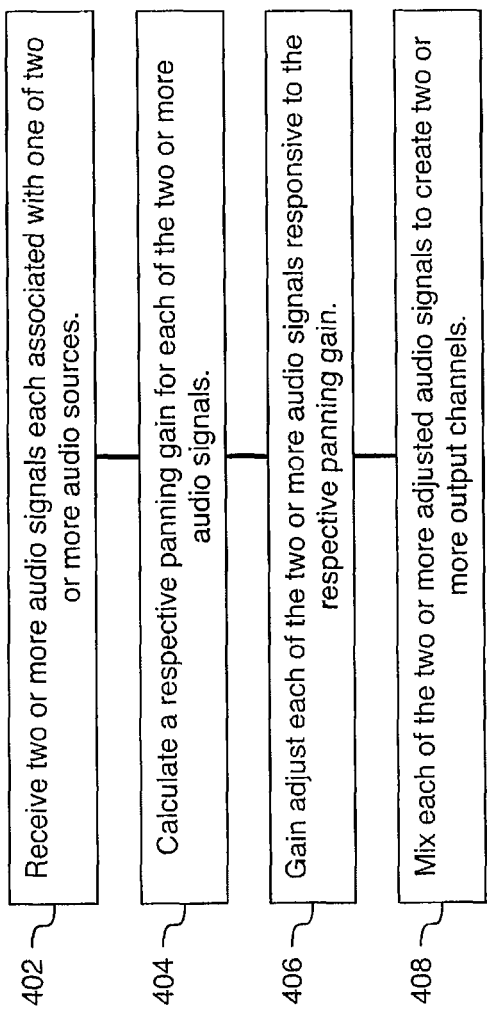
FIG. 4 is a representation of a method for enhancing comprehensibility through spatialization.

FIG. 4 is a representation of a method for enhancing comprehensibility through spatialization. The method 400 may be, for example, implemented using the systems 100 described herein with reference to FIG. 1. The method 400 includes the act of receiving two or more audio signals each associated with one of two or more audio sources 402. A respective panning gain may be calculated for each of the two or more audio signals using a count of the total number of audio sources and a count of a total number of output channels 404. The respective panning gain may be calculated further responsive to audio source metadata associated with each of two or more audio sources. Each of the two or more audio signals may be gain adjusted responsive to the respective panning gain 406. Each of the two or more gain adjusted audio signals may be mixed to create two or more output channels wherein a reproduction of the output channels produces enhanced comprehensibility 408.

Figure 5:
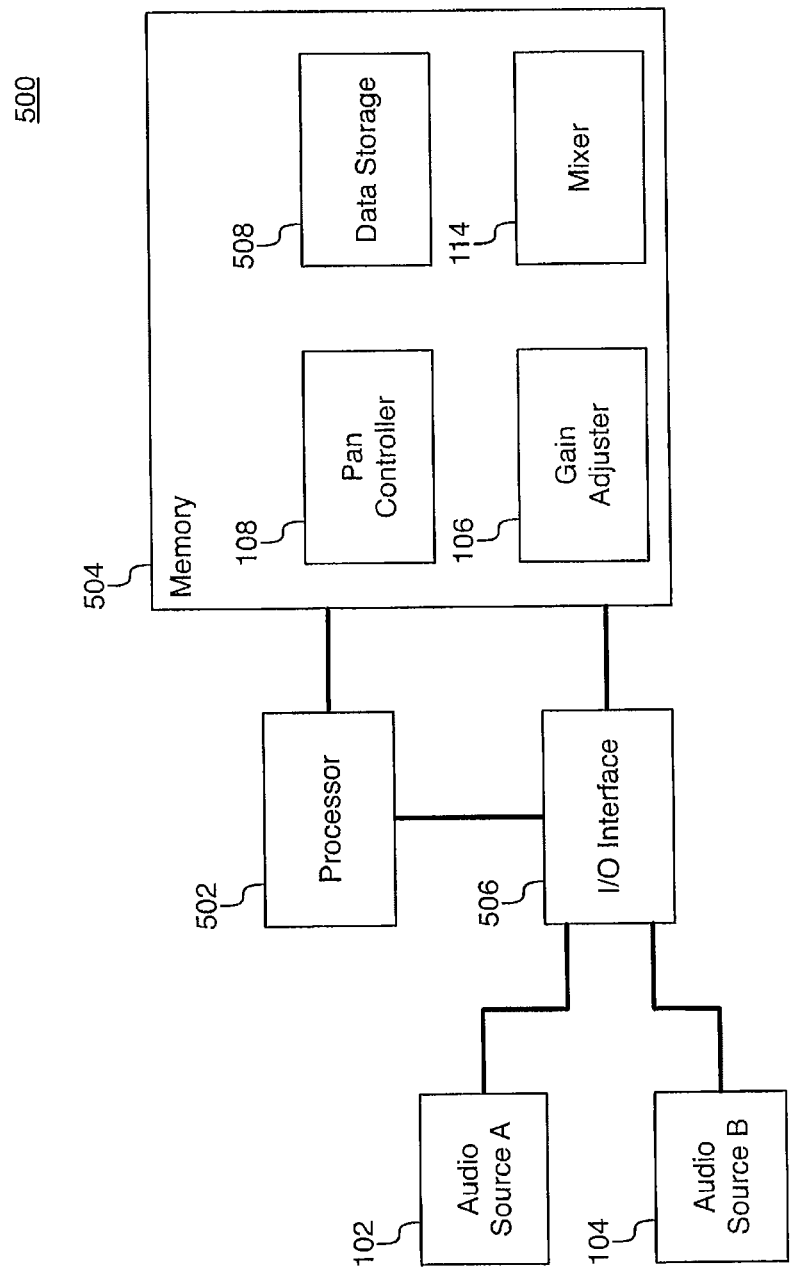
FIG. 5 is a further schematic representation of a system for enhancing comprehensibility through spatialization.

FIG. 5 is a further schematic representation of a system for enhancing comprehensibility through spatialization. The system 500 comprises a processor 502, memory 504 (the contents of which are accessible by the processor 502) and an I/O interface 506. The memory 504 may store instructions which when executed using the process 502 may cause the system 500 to render the functionality associated with enhancing comprehensibility through spatialization as described herein. For example, the memory 504 may store instructions which when executed using the processor 502 may cause the system 500 to render the functionality associated with the gain adjuster 106, the pan controller 108, and the mixer 116 as described herein. In addition, data structures, temporary variables and other information may store data in data storage 508.

The processor 502 may comprise a single processor or multiple processors that may be disposed on a single chip, on multiple devices or distributed over more that one system. The processor 502 may be hardware that executes computer executable instructions or computer code embodied in the memory 504 or in other memory to perform one or more features of the system. The processor 502 may include a general purpose processor, a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 504 may comprise a device for storing and retrieving data, processor executable instructions, or any combination thereof. The memory 504 may include non-volatile and/or volatile memory, such as a random access memory (RAM), a read-only memory (ROM), an erasable programmable read-only memory (EPROM), or a flash memory. The memory 504 may comprise a single device or multiple devices that may be disposed on one or more dedicated memory devices or on a processor or other similar device. Alternatively or in addition, the memory 504 may include an optical, magnetic (hard-drive) or any other form of data storage device.

The memory 504 may store computer code, such as the gain adjuster 106, the pan controller 108, and the mixer 116 as described herein. The computer code may include instructions executable with the processor 502. The computer code may be written in any computer language, such as C, C++, assembly language, channel program code, and/or any combination of computer languages. The memory 504 may store information in data structures including, for example, panning gains.

The I/O interface 506 may be used to connect devices such as, for example, audio sources (102 and 104), and to other components of the system 500.

All of the disclosure, regardless of the particular implementation described, is exemplary in nature, rather than limiting. The system 500 may include more, fewer, or different components than illustrated in FIG. 5. Furthermore, each one of the components of system 500 may include more, fewer, or different elements than is illustrated in FIG. 5. Flags, data, databases, tables, entities, and other data structures may be separately stored and managed, may be incorporated into a single memory or database, may be distributed, or may be logically and physically organized in many different ways. The components may operate independently or be part of a same program or hardware. The components may be resident on separate hardware, such as separate removable circuit boards, or share common hardware, such as a same memory and processor for implementing instructions from the memory. Programs may be parts of a single program, separate programs, or distributed across several memories and processors.

The functions, acts or tasks illustrated in the figures or described may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing, distributed processing, and/or any other type of processing. In one embodiment, the instructions are stored on a removable media device for reading by local or remote systems. In other embodiments, the logic or instructions are stored in a remote location for transfer through a computer network or over telephone lines. In yet other embodiments, the logic or instructions may be stored within a given computer such as, for example, a CPU.

While various embodiments of the system and method enhancing comprehensibility through spatialization have been described, it will be apparent to those of ordinary skill in the art that many more embodiments and implementations are possible within the scope of the present invention. Accordingly, the invention is not to be restricted except in light of the attached claims and their equivalents.

The invention claimed is:

1. A method for enhancing comprehensibility through spatialization comprising:
   receiving two or more audio signals each associated with one of two or more audio sources;

calculating a respective panning gains for each of the two or more audio signals, respectively based on the total number of audio sources and the total number of output channels;

gain adjusting each of the two or more audio signals responsive to the respective panning gain; and mixing each of the two or more gain adjusted audio signals to create two or more output channels wherein a reproduction of the output channels produces enhanced comprehensibility.

2. The method for enhancing comprehensibility through spatialization of claim 1, further comprising receiving audio source metadata associated with each of the two or more audio sources.

3. The method for enhancing comprehensibility through spatialization of claim 2, calculating the respective panning gains for each of the two or more audio signals, respectively, based on the audio source metadata associated with each of the two or more audio sources.

4. The method for enhancing comprehensibility through spatialization of claim 3, where the audio source metadata comprises any one or more of audio source priority, audio source grouping, and audio source role assignment.

5. The method for enhancing comprehensibility through spatialization of claim 3, where the audio source metadata comprises an Internet Protocol address.

6. The method for enhancing comprehensibility through spatialization of claim 3, calculating the respective panning gain further responsive to a received near end panning control.

7. The method for enhancing comprehensibility through spatialization of claim 1, further comprising reproducing the two or more output channels to create a sound field.

8. The method for enhancing comprehensibility through spatialization of claim 1, where calculating the respective panning gain comprises a calculation to direct each of the two or more audio signals to separated positions in the sound field.

9. The method for enhancing comprehensibility through spatialization of claim 4, where calculating the respective panning gain comprises a calculation to direct each of the two or more audio signals to a relative location in the two or more output channels responsive to the audio source meta data.

10. A system for enhancing comprehensibility through spatialization comprising:

two or more gain adjusters to receive audio signals associated with one of two or more audio sources;

a panning controller to calculate panning gains for each of the two or more audio signals, respectively, based on the total number of audio sources and the total number of output channels;

the two or more gain adjusters gain adjust each of the two or more audio signals responsive to the respective panning gain; and two or more mixers to mix each of the two or more gain adjusted audio signals to create two or more output channels wherein a reproduction of the output channels produces enhanced comprehensibility.

11. The system for enhancing comprehensibility through spatialization of claim 10, where the panning controller is configured to receive audio source metadata associated with each of two or more audio sources.

12. The system for enhancing comprehensibility through spatialization of claim 11, where the panning controller calculates the panning gains for each of the two or more audio signals using the audio source metadata.

13. The system for enhancing comprehensibility through spatialization of claim 11, where the panning roller calculates the panning gains for each of the two or more audio signals, respectively, based on audio source metadata designating any one or more of audio source priority, audio source grouping, and audio source role assignment.

14. The system for enhancing comprehensibility through spatialization of claim 13, where the audio source metadata comprises an Internet Protocol address.

15. The system for enhancing comprehensibility through spatialization of claim 11, there the panning controller is responsive to a received near end panning control.

16. The system for enhancing comprehensibility through spatialization of claim 10, further comprising two or more audio transducers to reproduce the two or more output channels to create a sound field from the two or more output channels.

17. The system for enhancing comprehensibility through spatialization of claim 10, where calculating the panning gains comprises a calculation to direct each of the two or more audio signals to separated positions in the sound field.

18. The system for enhancing comprehensibility through spatialization of claim 13, where calculating the panning gains comprises a calculation to direct each of the two or more audio signals to a relative location in the two or more output channels responsive to the audio source meta data.

* * * * *

UNITED STATES PATENT AND TRADEMARK OFFICE
CERTIFICATE OF CORRECTION

PATENT NO. : 9,337,790 B2
APPLICATION NO. : 14/089318
DATED : May 10, 2016
INVENTOR(S) : Phillip Alan Hetherington et al.

It is certified that error appears in the above-identified patent and that said Letters Patent is hereby corrected as shown below:

In the Claims

In column 8, claim 13, line 21, after "where the panning" replace "roller" with --controller--.

In column 8, claim 15, line 30, before "the panning controller is" replace "there" with --where--.

Signed and Sealed this
Twenty-third Day of August, 2016

Michelle K. Lee
*Director of the United States Patent and Trademark Office*